(12) United States Patent
Niu et al.

(10) Patent No.: US 11,626,268 B2
(45) Date of Patent: Apr. 11, 2023

(54) INDUCTION COIL ASSEMBLY AND REACTION CHAMBER

(71) Applicant: BEIJING NAURA MICROELECTRONICS EQUIPMENT CO., LTD., Beijing (CN)

(72) Inventors: Chen Niu, Beijing (CN); Gang Wei, Beijing (CN); Hengyi Su, Beijing (CN); Jing Yang, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 46 days.

(21) Appl. No.: 17/286,742

(22) PCT Filed: Sep. 27, 2019

(86) PCT No.: PCT/CN2019/108527
§ 371 (c)(1),
(2) Date: Apr. 19, 2021

(87) PCT Pub. No.: WO2020/088169
PCT Pub. Date: May 7, 2020

(65) Prior Publication Data
US 2021/0375587 A1   Dec. 2, 2021

(30) Foreign Application Priority Data

Oct. 30, 2018  (CN) .......................... 201811276620.2
Oct. 30, 2018  (CN) .......................... 201821770439.2
Sep. 9, 2019   (CN) .......................... 201910861309.2

(51) Int. Cl.
*H01J 37/32* (2006.01)

(52) U.S. Cl.
CPC ................................. *H01J 37/3211* (2013.01)

(58) Field of Classification Search
USPC ............................................. 315/111.21, 153
See application file for complete search history.

(56) References Cited

U.S. PATENT DOCUMENTS 5,650,032 A * 7/1997 Keller ................... H01J 37/321
                                                    204/298.34
6,155,199 A * 12/2000 Chen .................. H01J 37/32174
                                                        118/723 R (Continued)

FOREIGN PATENT DOCUMENTS

CN       2726076 Y      9/2005
CN     101136279 A      3/2008

(Continued)

OTHER PUBLICATIONS

World Intellectual Property Organization (WIPO) International Search Report for PCT/CN2019/108527 dated Dec. 27, 2019 6 Pages (including translation).

*Primary Examiner* — Srinivas Sathiraju
(74) *Attorney, Agent, or Firm* — Anova Law Group PLLC

(57) ABSTRACT

The present disclosure provides an induction coil assembly and a reaction chamber. The induction coil assembly includes an induction coil arranged over a dielectric window of the reaction chamber. Two ends of the induction coil include a power input end and a ground end, respectively. A vertical spacing between the two ends of the induction coil and the dielectric window is greater than a vertical spacing between a portion between the two ends of the induction coil and the dielectric window. The induction coil and the reaction chamber provided by the present disclosure may reduce the capacitive coupling of the two ends of the induction coil by ensuring that the coupling strength of an (Continued)

RF magnetic field satisfies the requirement to reduce sputtering on the dielectric window and improve process results.

20 Claims, 5 Drawing Sheets

(56) References Cited

U.S. PATENT DOCUMENTS

| | | | | |
|---|---|---|---|---|
| 6,164,241 | A * | 12/2000 | Chen | H01J 37/321 |
| | | | | 427/569 |
| 6,251,241 | B1 * | 6/2001 | Shin | H01J 37/321 |
| | | | | 204/298.34 |
| 8,314,560 | B2 | 11/2012 | Nakagami et al. | |
| 10,147,586 | B2 * | 12/2018 | Song | H01F 27/28 |
| 10,854,482 | B2 * | 12/2020 | Li | H01J 37/32119 |
| 2002/0121345 | A1 * | 9/2002 | Chen | C23C 16/507 |
| | | | | 156/345.48 |
| 2003/0111963 | A1 * | 6/2003 | Tolmachev | H01J 37/32357 |
| | | | | 315/111.51 |
| 2004/0255864 | A1 | 12/2004 | Jeon et al. | |
| 2005/0103444 | A1 * | 5/2005 | Brcka | H01J 37/321 |
| | | | | 156/345.48 |
| 2005/0103445 | A1 * | 5/2005 | Brcka | H01J 37/321 |
| | | | | 156/345.48 |
| 2009/0149028 | A1 * | 6/2009 | Marakhtanov | H01J 37/321 |
| | | | | 156/345.48 |
| 2011/0094682 | A1 * | 4/2011 | Yamazawa | H01J 37/3211 |
| | | | | 156/345.29 |
| 2011/0094997 | A1 * | 4/2011 | Yamazawa | H01L 21/67069 |
| | | | | 216/68 |
| 2021/0375587 | A1 * | 12/2021 | Niu | H01J 37/3211 |

FOREIGN PATENT DOCUMENTS

| | | |
|---|---|---|
| CN | 201869430 U | 6/2011 |
| CN | 103347360 A | 10/2013 |
| CN | 104602434 A | 5/2015 |
| CN | 104620434 A | 5/2015 |
| CN | 104637767 A | 5/2015 |
| CN | 104684235 A | 6/2015 |
| CN | 106816396 A | 6/2017 |
| CN | 208923027 U | 5/2019 |
| TW | 201616545 A | 5/2016 |

* cited by examiner

INDUCTION COIL ASSEMBLY AND REACTION CHAMBER

CROSS-REFERENCE TO RELATED APPLICATIONS

This application is a national Phase entry under 35 U.S.C. 071 of International Application No. PCT/CN2019/108527. filed on Sep. 27, 2019. which claims priority to Chinese Application No. 201811276620.2 filed Oct. 30, 2018. and Chinese Application No. 201821770439.2. filed Oct. 30, 2018. and Chinese Application No. 201910861309.2. filed Sep. 9, 2019. the entire contents of all of which are incorporated herein by reference.

TECHNICAL FIELD

The present disclosure generally relates to the semiconductor manufacturing field and, more particularly, to an induction coil assembly and a reaction chamber.

BACKGROUND

Radiofrequency (RF) inductive coupled plasma (ICP) has higher discharge efficiency than capacitance coupled plasma (CCP), and can produce high-density plasma at a lower pressure (1~100 mTorr). Therefore, ICP apparatuses are widely used in etching and deposition processes in the semiconductor field. In an ICP apparatus, an RF current flowing in an induction coil may excite an RF magnetic field in space, and generate an angular electric field in the plasma by Faraday electromagnetic induction to heat electrons to generate a high-density plasma.

FIG. 1 is a cross-sectional view of a current ICP reaction chamber. Referring to FIG. 1, a reaction chamber 1 includes a dielectric window 3 at the top of the chamber and a planar coil 2 arranged above the dielectric window 3. Two ends of the planar coil 2 include a power input end A and a series capacitor terminal B, respectively. The power input end A is electrically connected to an RF power supply 4. The series capacitor terminal B is grounded through a capacitor 5. By setting the capacitor 5, voltages of the power input end A and the series capacitor terminal B may be set to be equal. Thus, the current and voltage of the planar coil 2 may be symmetrically distributed. Therefore, an angularly uniform plasma may be obtained, at the same time, it is also beneficial for plasma ignition.

However, since the potential of the planar coil 2 the power input end A and the series capacitor terminal B is relatively high, and the power input end A and the series capacitor terminal B are closer to the plasma (a vertical distance to the dielectric window 3 being small), the power input end A and the series capacitor terminal B form a strong capacitive coupling with the ground, which may result in the formation of a high-voltage sheath at the lower surface of the dielectric window 3. This high-voltage sheath may cause the lower surface of the dielectric window 3 to be sputtered, which generates sputter pollution and affects process results.

SUMMARY

The present disclosure is intended to at least solve one of the technical problems in the existing technology. The present disclosure provides an induction coil assembly and a reaction chamber. The induction coil assembly and the reaction chamber can reduce the capacitive coupling of the two ends of the induction coil by ensuring that the coupling strength of an RF magnetic field satisfies the requirement to reduce sputtering on the dielectric window and improve process results.

To realize the purposes of the present disclosure, an induction coil assembly is provided including an induction coil arranged over a dielectric window of a reaction chamber. Two ends of the induction coil include a power input end and a ground end, respectively. Vertical distances between the two ends of the induction coil and the dielectric window are greater than a vertical distance between a portion between the two ends of the induction coil and the dielectric window.

Optionally, the induction coil includes a first coil segment and a second coil segment connected in series that have a three-dimensional spiral structure. A spiral radius of the first coil segment decreases gradually from an end of the induction coil to a series connection point of the first coil segment and the second coil segment. A spiral radius of the second coil segment decreases gradually from the series connection point of the first coil segment and the second coil segment to another end of the induction coil. A vertical distance between the first coil segment and the dielectric window decreases gradually from the end of the induction coil to the series connection point of the first coil segment and the second coil segment. A vertical distance between the second coil segment and the dielectric window decreases gradually from the another end of the induction coil to the series connection point.

Optionally, lengths of the first coil segment and the second coil segment both are three-quarter turn or an integer multiple of the three-quarter turn.

Optionally, an end of the induction coil close to the first coil segment is the power input end, and another end of the induction coil close to the second segment is the ground end.

Optionally, the induction coil includes a first coil segment, a second coil segment, and a third coil segment connected in series from an end of the induction coil to another end of the induction coil. The first coil segment and the third coil segment have a three-dimensional spiral structure. The second coil segment has a planner spiral structure. A spiral radius of the first coil segment decreases gradually from the end of the induction coil to a first series connection point of the first coil segment and the second coil segment. A spiral radius of the second coil segment decreases gradually from the first series connection point to a second series connection point of the second coil segment and the third coil segment. A spiral radius of the third coil segment decreases gradually from the second series connection point to the another end of the induction coil.

A vertical distance between the first coil segment and the dielectric window decreases gradually from the end of the induction coil to the first series connection point. A vertical distance between the third coil segment and the dielectric window decreases gradually from the another end of the induction coil to the second series connection point. Vertical distances between positions of the second coil segment and the dielectric window are same.

Optionally, lengths of the first coil segment, the second coil segment, and the third coil segment are all half turn or an integer multiple of the half turn.

Optionally, the end of the induction coil close to the first coil segment is the power input end, and the another end of the induction coil close to the third coil segment is the ground end.

Optionally, vertical distances between the two ends of the induction coil and the dielectric window are same.

Optionally, vertical distances between the two ends of the induction coil and a lower surface of the dielectric window range from 10 to 50 mm.

Optionally, one induction coil is included, or two induction coils are included, arranged coaxially, sleeved with each other, and centrosymmetric about axes of the induction coils.

Optionally, a cross-sectional shape of the induction coil includes a rectangle, a circle, a triangle, a trapezoid, or a diamond.

As another technical solution, the present disclosure further provides a reaction chamber including a dielectric window and the induction coil assembly provided by the present disclosure. The induction coil assembly includes an induction coil arranged over the dielectric window. Two ends of the induction coil include a power input end and a ground end, respectively. The power input end is electrically connected to an RF power supply. The ground end is electrically connected to ground.

Optionally, the reaction chamber further includes a capacitor connected between the ground end and the ground.

Optionally, the capacitor ranges from C1 to C2:

$$C1 = \frac{1}{\omega^2 L}; \text{ and}$$
$$C2 = \frac{4}{\omega^2 L};$$

wherein ω denotes an angular frequency, and L denotes an inductance of the induction coil.

Optionally, one induction coil assembly is included, or a plurality of induction coil assemblies are included and are distributed on a plurality of circumferences with different radiuses and centered on an axis of the dielectric window. Power input ends of the plurality of induction coil assemblies are each electrically connected to the same RF power supply. A plurality of capacitors are included. Ground ends of the plurality of induction coil assemblies are electrically connected to the plurality of capacitors in a one-to-one correspondence.

Optionally, one induction coil assembly is included. An end of the induction coil farther from the dielectric window is the power input end, and an end of the induction coil closer to the dielectric window is the ground end. The reaction chamber further includes one cone-shaped induction coil assembly. The cone-shaped induction coil assembly and the induction coil assembly are located on two circumferences with different radiuses centered on an axis of the dielectric window. The cone-shaped induction coil includes two cone-shaped induction coils. Two cone-shaped induction coils are arranged over the dielectric window, all have a three-dimensional spiral structure, and are centered on axes of the cone-shaped induction coils. A spiral radius of each cone-shaped induction coil decreases gradually from bottom to top along a vertical direction. An end of each cone-shaped induction coil farther from the window dielectric window is the power input end. An end of each cone-shaped induction coil closed to the dielectric window is the ground end.

Optionally, a radius of a circumference, on which the cone-shaped induction coil is located, is smaller than a radius of a circumference, on which the cone-shaped induction coil is located.

The present disclosure has the following beneficial effects.

The induction coil assembly provided by the present disclosure can reduce the capacitive coupling of the two ends of the induction coil assembly by causing vertical distances between the two ends (the power input end and the ground end) with higher potentials of the induction coil and the dielectric window to be larger than a vertical distance between the portion between the two ends of the induction coil and the dielectric window. Thus, the sputtering on the dielectric window can be reduced, and the process results may be improved. Meanwhile, since the vertical distance between the portion of the two ends of the induction coil and the dielectric window is relatively small, the coupling strength of the RF magnetic field can be ensured to satisfy the requirements to ensure the normal ignition of the plasma.

The reaction chamber provided by the present disclosure, by using the induction coil assembly provided by the present disclosure, can reduce the capacitive coupling of the two ends of the induction coil by ensuring that the coupling strength of an RF magnetic field satisfies the requirement to reduce sputtering on the dielectric window and improve process results.

DETAILED DESCRIPTION OF THE EMBODIMENTS

To make those of ordinary skill in the art to better understand the technical solutions of the present disclosure, an induction coil assembly and a reaction chamber provided by the present disclosure may be described in detail below in connection with the accompanying drawings.

Figure 1:
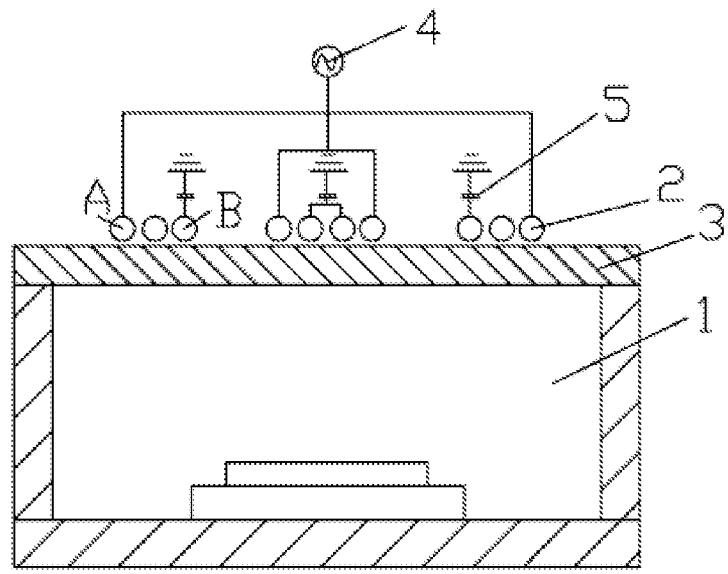
FIG. 1 illustrates a schematic cross-section view of an existing ICP reaction chamber.
Figure 2:
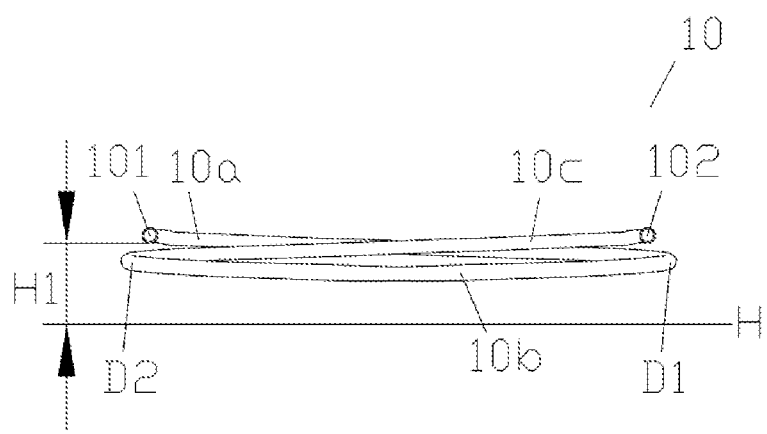
FIG. 2 illustrates a schematic structural diagram of an induction coil according to a first embodiment of the present disclosure.
Figure 3:
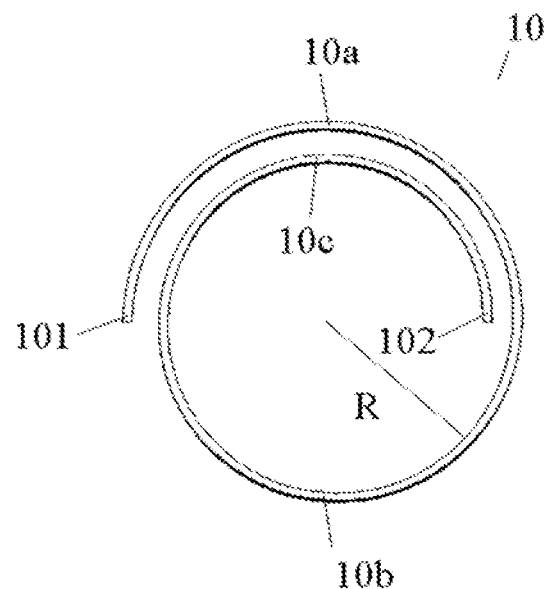
FIG. 3 illustrates a top view of the induction coil according to the first embodiment of the present disclosure.

Referring to FIG. 2 and FIG. 3, a first embodiment of the present disclosure provides an induction coil assembly, which includes an induction coil 10 arranged above a dielectric winder of a reaction chamber. By applying RF power to the induction coil 10, process gas in the reaction chamber may be excited to form a plasma. Two ends of the induction coil 10 (101, 102) are a power input end and a ground end, respectively. The power input end may be configured to be electrically connected to the RF power supply. The ground ends may be configured for grounding.

In practical applications, a capacitor is usually be connected in series between the ground end and the ground. By setting the capacitor, voltages of the power input end and the ground end may be equal. Thus, the current and voltage in the induction coil may be symmetrically distributed to obtain an angularly uniform plasma. At the same time, it is also beneficial to plasma ignition. However, the potentials of the power input end and the ground end may be relatively high, which may generate a higher capacitive coupling.

To solve the problem of the higher capacitive coupling, in some embodiments, a vertical distance between the dielectric window and each end of the two ends of the induction coil 10 (101, 102) is greater than a vertical distance between the dielectric window and a portion of the induction coil 10 that is between the two ends (101, 102) of the induction coil 10 (excluding the two ends). Specifically, as shown in FIG. 2, the lower surface of the dielectric window is indicated as "H". The vertical distance between each end of the two ends (101, 102) of the induction coil 10 and the lower surface H of the dielectric window is indicated as "H1" along a direction perpendicular to the lower surface H. In this case, the vertical distance between the portion between the two ends (101, 102) of the induction coil 10 and the lower surface H of the dielectric window is smaller than H1, that is, the vertical distance H1 is a maximum distance between induction coil 10 and the lower surface H of the dielectric window.

According to the following equation:

$$C_d = \frac{\varepsilon s}{d}$$

It can be seen that an equivalent capacitance $C_d$ between a coil and the lower surface of the dielectric window is inversely proportional to the vertical distance d, that is, the larger the vertical distance d is, and the smaller the equivalent capacitance $C_d$ is, and the smaller the capacitive coupling is. On the contrary, the smaller the vertical distance d is, the larger the equivalent capacitance $C_d$ is, and the larger the capacitive coupling is. Based on this, although the potential of the two ends (101, 102) of the induction coil 10 is relatively high, the two ends are farthest from the dielectric window compared to other portions of the induction coil 10. That is, the vertical distance is the largest, which causes the equivalent capacitance $C_d$ at both ends (101, 102) of the induction coil 10 to be the smallest. Thus, the capacitive coupling is the smallest.

Thus, the capacitive coupling between the two ends (101, 102) of the induction coil 10 may be effectively reduced to reduce the sputtering pollution caused by the sputtering of the plasma to the dielectric window and improve the process result. At the same time, since the portion between the two ends (101, 102) of the induction coil 10 is closer to the dielectric window compared to the two ends (101, 102). That is, the vertical distance is smaller. The smaller the vertical distance is, the stronger the coupling strength of the RF magnetic field is, which is beneficial to improve the coupling efficiency and ensure a normal ignition of the plasma. Therefore, although the two ends (101, 102) of the inductive coil 10 is relative far away from the dielectric window, with the portion between the two ends (101, 102), the coupling strength of the RF magnetic field may still satisfy a requirement to ensure the normal ignition of the plasma.

Optionally, a range of the vertical distances between the two ends (101, 102) of the induction coil 10 and the lower surface of the dielectric window is 10~50 mm. In this range, the capacitive coupling may be better reduced, which may effectively reduce the sputtering pollution caused by the sputtering of the plasma to the dielectric window and improve the process results.

A specific structure of the induction coil 10 is described in detail below. Specifically, in some embodiments, the induction coil 10 includes a first coil segment 10a, a second coil segment 10b, and a third coil segment 10c that are sequentially connected in series from the first end 101 to the second end 102. The first coil segment 10a and the third coil segment 10c both have a three-dimensional spiral structure. The three-dimensional spiral structure refers to a coil wound in a three-dimensional space to form a spiral structure. For example, a columnar spiral structure or a cone spiral structure. The second coil segment 10b has a two-dimensional spiral structure. That is, the coil is wound in a two-dimensional plane to form a spiral structure.

In addition, a spiral radius of the first coil segment 10a, the second coil segment 10b, and the third coil segment 10c gradually decreases from the first end 101 of the induction coil 10 to the second end 102 of the induction coil. The spiral radius may refer to a radius of a spiral structure formed by winding the coil. For example, a radius R shown in FIG. 3 is the spiral radius of any position of the induction coil 10.

It should be noted that the spiral radius of the first end 101 of the induction coil 10 may be the largest, and the spiral radius of the second end 101 of the induction coil 10 may be the smallest. The spiral radius of the same coil segment may gradually decrease from an end close to the first end 101 to another end.

It should be noted that, in some embodiments, the spiral radius of the first end 101 of the induction coil 10 may be the largest, and the spiral radius of the second end 102 of the induction coil 10 may be the smallest. However, the present disclosure is not limited to this. In practical applications, the spiral radius of the first end 101 of the induction coil 10 may be the smallest, and the spiral radius of the second end 102 of the induction coil 10 may be the largest. The spiral radius of the first coil segment 10a, the second coil segment 10b, and the third segment 10c may gradually increase from the first end 101 of the induction coil 10 to the second end 102.

As shown in FIG. 2, a series connection point between the first coil segment 10a and the second coil segment 10b is a first series connection point D1. A series connection point between the third coil segment 10c and the second coil segment 10b may be a second series connection point D2. It is easy to understand that the series connection point is only a virtual dividing point used to divide two adjacent coil segments. In an actual structure, the induction coil 10 may be still a continuous coil.

For the first coil segment 10a, one end of the first coil segment 10a may be the first end 101 of the induction coil 10, which has the largest vertical distance to the dielectric window. The other end of the first coil segment 10a is the first serial connection point D1, which has the smallest vertical distance to the dielectric window. The vertical distance of the remaining part of the first coil segment 10a may gradually decrease from the first end 101 to the first series connection point D1.

For the third coil segment 10c, one end of the third coil segment 10c may be the second end 102 of the induction coil 10, which has the largest vertical distance to the dielectric window. The other end of the third coil segment 10c may be the second serial connection point D2, which has the smallest vertical distance between it and the dielectric window. The vertical distance of the remaining portion of the third coil segment 10c may gradually decrease from the first end 101 to the first series connection point D2.

For the second coil segment 10b, two ends of the second coil segment 10b may be the first serial connection point D1 and the second serial connection point D2, respectively. Moreover, since the second coil segment 10b has a two-dimensional spiral structure, the vertical distances between various positions on the second coil segment 10b and the dielectric window may be equal. That is, the vertical distance between the first series connection point D1 and the second series connection point D2 and the dielectric window may be also equal.

The vertical distance between an entire segment of the second coil segment 10b and the dielectric window may be the smallest, which may ensure that the coupling strength of the RF magnetic field satisfies the requirements and ensure that the plasma can be normally ignited. At the same time, the vertical distance between the first coil segment 10a and the third coil segment 10c and the dielectric window may gradually increase from the first series connection point D1 and the second series connection point D2 to the two ends (101, 102). Thus, the capacitive coupling of the two ends (101, 102) of the induction coil 10 may be effectively reduced, which may reduce the sputtering pollution caused by the sputtering of the plasma on the dielectric window, and improve the process result.

The length value of the induction coil may affect the inductance value of the coil. That is, the longer the length of the induction coil is, the greater the inductance value is, and thus the greater the voltage on the coil is. On contrary, the shorter the length of the induction coil is, the smaller the inductance value is, and thus the smaller the voltage on the coil is. It can be seen that the length of the induction coil should not be too long, otherwise, the voltage on the coil may be large. However, the length of the induction coil should not be too short either, otherwise, the inductance value may be too small, and the matching range of the matching network cannot be reached. Based on this, preferably, in some embodiments, the lengths of the first coil segment 10a, the second coil segment 10b, and the third coil segment 10c are all half turns. Three coil segments may be connected in series to form a total length of 1.5 turns of the induction coil 10. The inductance value of the induction coil 10 of the length may be moderate, and the voltage on the coil may be reduced by ensuring that the inductance value of the induction coil is within the matching range of the matching network. Of course, in practical applications, the respective lengths of the first coil segment 10a, the second coil segment 10b, and the third coil segment 10c may also be set according to specific needs. For example, the length of each coil segment may also be an integer multiple of half turn. For example, 3 turns or 4.5 turns.

Optionally, the first end 101 of the induction coil 10 close to the first coil segment 10a may be the power input end. The second end 102 of the induction coil 10 close to the third coil segment 10c may be the ground end. Of course, in practical applications, the first end 101 may also be the ground end, and the second end 102 may be the power input end.

Optionally, a cross-sectional shape of the induction coil 10 may include a rectangle, a circle, a triangle, a trapezoid, a diamond, etc.

Figure 4:
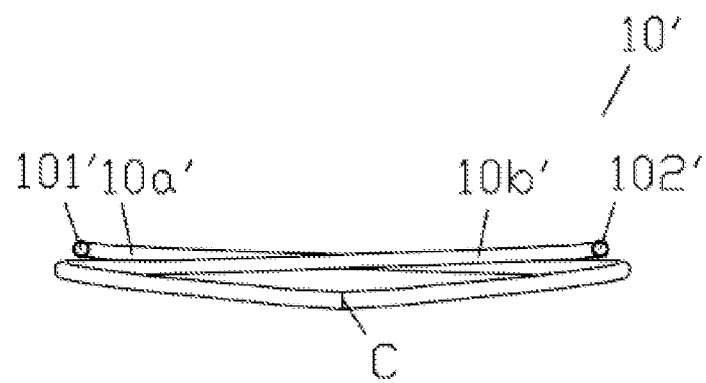
FIG. 4 illustrates a schematic structural diagram of an induction coil according to a second embodiment of the present disclosure.

Referring to FIG. 4, a second embodiment of the present disclosure provides an induction coil assembly. Compared to the above-mentioned first embodiment, the induction coil assembly includes an induction coil 10'. Differences between the induction coil 10' provided in a second embodiment and the induction coil 10 of the above-mentioned first embodiment are described in detail below.

Specifically, the induction coil 10' includes a first coil segment 10a' and a second coil 10b' connected in series from a first end 101' to a second end 102'. Both coils have three-dimensional structures. A spiral radius of the first coil segment 10a' and the second coil segment 10b' may gradually decrease from the first end 101' of the induction coil 10' to the second end 102'.

It should be noted that the spiral radius of the first end 101' of the induction coil 10' may be the largest, and the spiral radius of the second end 102' of the induction coil 10' may be the smallest. The spiral radius of the same coil segment may gradually decrease from an end close to the first end 101' to the other end.

It should also be noted that, in some embodiments, the spiral radius of the first end 101' of the induction coil 10' is the largest, and the spiral radius of the second end 102' of the induction coil 10' is the smallest. However, the present disclosure is not limited to this. In practical applications, the spiral radius of the first end 101' of the induction coil 10' may also be the smallest, and the spiral radius of the second end 102' of the induction coil 10' may be the largest. The spiral radius of the first coil segment 10a' and the second coil segment 10b' may gradually increase from the first end 101' of the induction coil 10 to the second end 102'.

As shown in FIG. 4, a series connection point of the first coil segment 10a' and the second coil segment 10b' is a connection point C. For the first coil segment 10a', one end of the first coil segment 10a' is the first end 101' of the induction coil 10', which has the largest vertical distance to the dielectric window. The other end of the first coil segment 10a may be the first serial connection point C, which has the smallest vertical distance to the dielectric window. The vertical distance of the remaining portion of the first coil segment 10a' may gradually decrease from the first end 101' to the first series connection point C.

For the second coil segment 10b', one end may be the second end 102' of the induction coil 10', which has the largest vertical distance to the dielectric window. The other end of the second coil segment 10b' may be the serial connection point C, which has the vertical distance to the dielectric window. The vertical distance of the remaining portion of the second coil segment 10b' may gradually decrease from the second end 102' to the series connection point C.

It can be seen from the above that the first coil segment 10a' and the second coil segment 10b' can make the vertical distance between the dielectric window gradually increase from the series connection point C to the two ends (101', 102'). Thus, the capacitive coupling of the two ends (101', 102') of the induction coil 10' may be effectively reduced, the sputtering pollution caused by the sputtering of the plasma to the dielectric window may be reduced, and the process result may be improved. At the same time, the portions of the first coil section 10a' and the second coil section 10b' each close to the series connection point C may be closer to the dielectric window, which may also ensure the coupling strength of the RF magnetic field, improve the coupling efficiency, and ensure the normal ignition of the plasma.

In some embodiment, the lengths of the first coil segment 10a' and the second coil segment 10b' are both three-quarter turns. The two coil segments may also be connected in series to form the induction coil 10' with a total length of 1.5 turns. Of course, in practical applications, the respective lengths of the first coil segment 10a' and the second coil segment 10b' may be determined according to specific needs, for example, an integer multiple of three-quarter turns.

Optionally, the first end 101' of the induction coil 10 close to the first coil segment 10a' may be a power input end. The second end 102' of the induction coil 10' close to the second coil segment 10b' may be a ground end. Of course, in practical applications, the first end 101' may also be a ground end, and the second end 102' may be a power input end.

Figure 5:
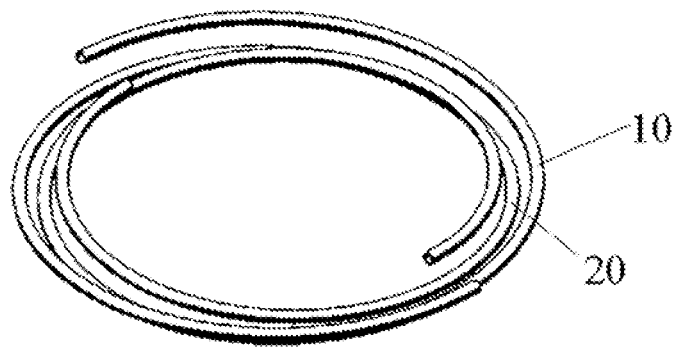
FIG. 5 illustrates a schematic structural diagram of an induction coil assembly according to a third embodiment of the present disclosure.
Figure 6:
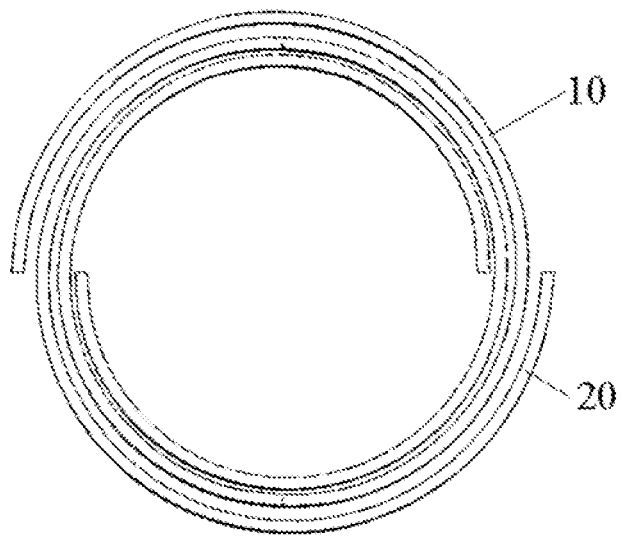
FIG. 6 illustrates a top view of an induction coil assembly according to the third embodiment of the present disclosure.

Referring to FIG. 5 and FIG. 6, a third embodiment of the present disclosure provides an induction coil assembly. Compared to the above-mentioned first and the second embodiments, the only difference is that the third embodiment includes two induction coils.

Specifically, the two induction coils (10, 20) may be coaxially arranged and sleeved with each other. The two induction coils (10, 20) may be centrosymmetric about an axis of the induction coil. That is, one of the induction coils may coincide with the other induction coil after rotating 180° around the axis of the induction coil.

Since the magnetic field generated by the two induction coils (10, 20) may be distributed more uniformly in a radial direction of the chamber compared to the magnetic field generated by a single induction coil. Thus, the angular distribution of the plasma may be more uniform, which may improve the process uniformity.

In practical applications, two induction coils (10, 20) may be connected in parallel.

In practical applications, more than three induction coils may also be included.

In summary, embodiments of the present disclosure provide the induction coil assembly. The capacitive coupling between the two ends of the induction coil may be reduced by causing the vertical distance between the two ends of the induction coil (the power input end and the ground end) with a higher potential to be greater than the vertical distance between the portion between the two ends of the induction coil to the dielectric window. Thus, the capacitive coupling at the two ends of the induction coil may be reduced, sputtering on the dielectric window may be reduced, and the process result may be improved. Meanwhile, since the vertical distance between the portion between the two ends of the induction coil and the dielectric window is small, the coupling strength of the RF magnetic field may be ensured.

Figure 7:
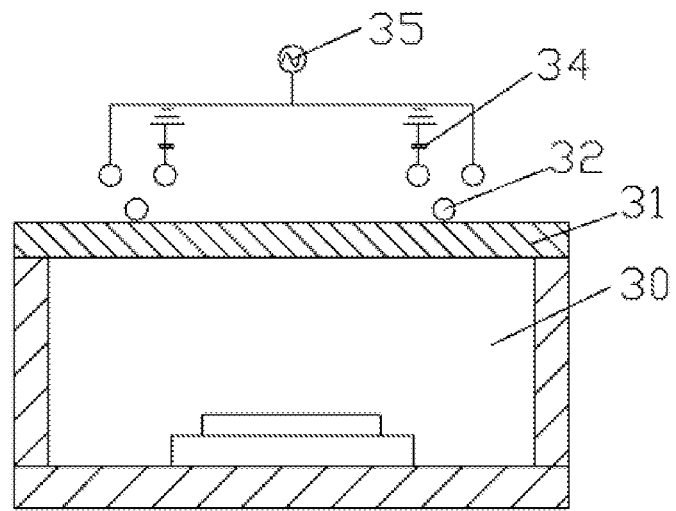
FIG. 7 illustrates a cross-section view of a reaction chamber according to a fourth embodiment of the present disclosure.

As another technical solution, referring to FIG. 7, a fourth embodiment of the present disclosure also provides a reaction chamber 30, which includes a dielectric window 31 arranged at a top of the chamber, and the induction coil assembly provided by the above-mentioned embodiments of the present disclosure.

The induction coil assembly includes an induction coil 32 arranged over the dielectric window 31. The induction coil 32 may use the induction coil structure described in the above-mentioned third embodiment. That is, two induction coils 32 may be included and connected in parallel. Two ends of each induction coil 32 may be the power input end and the ground end, respectively. The power input end is electrically connected to the RF power supply 35. The ground end is electrically connected to the ground.

In some embodiments, an end of each induction coil 32 close to an edge of the chamber may be the ground end. An end of each induction coil 32 close to the center of the chamber may be the power input end. However, in practical applications, the end of each induction coil 32 close to the edge of the chamber may be the power input end. The end of each induction coil 32 close to the center of the chamber may be the ground end.

In some embodiments, the reaction chamber also includes a capacitor 34. The capacitor 34 is connected between the ground end and the ground. By setting the capacitor 34, the voltages of the power input end and the ground end may be equal. Thus, the current and voltage of the induction coil 32 may be distributed symmetrically to obtain an angularly uniform plasma. Meanwhile, it is beneficial to plasma ignition.

Optionally, a value range of the capacitor 34 may be C1~C2:

$$C1 = \frac{1}{\omega^2 L}$$

$$C2 = \frac{4}{\omega^2 L}$$

Where $\omega$ denotes an angular frequency, and L denotes the inductance of the induction coil 32.

The value of the capacitor 34 may be adjusted within the above-mentioned value range. The distribution of the RF voltage and current may be adjusted in the induction coil 32 to obtain the angularly uniform plasma. Meanwhile, it is beneficial for plasma ignition.

It should be noted that, in some embodiments, the induction coil assembly may include one assembly. However, the present disclosure is not limited to this. In practical applications, the induction coil may include a plurality of assemblies. Moreover, a plurality of induction coil assemblies may be respectively located on a plurality of circumferences with different radiuses centered on the axis of the dielectric window 31. Moreover, the power input ends of the induction coils of the plurality of induction coil assemblies may be all electrically connected to the same RF power supply 35. A plurality of capacitors 34 are included. The ground ends of the induction coils of the plurality of induction coil assemblies may be electrically connected to the plurality of capacitors 34 in a one-to-one correspondence.

By arranging the plurality of the induction coil assemblies, the uniformity of the plasma distribution in the radial direction of the reaction chamber 30 may be improved.

Figure 8:
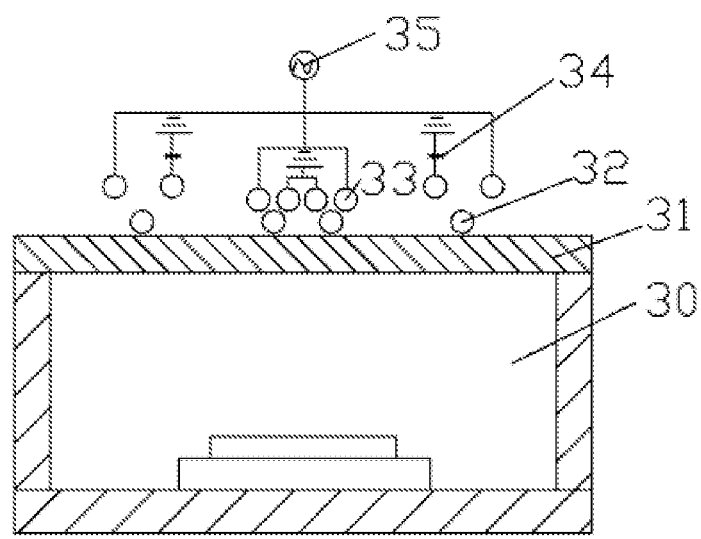
FIG. 8 illustrates another cross-section view of the reaction chamber according to the fourth embodiment of the present disclosure.

For example, as shown in FIG. 8, two induction coil assemblies are included. A first induction coil assembly includes two induction coils 32 connected in parallel to each other. The two induction coils 32 are arranged same as the induction coils of the above-mentioned third embodiment. Similarly, a second induction coil assembly includes two induction coils 23 connected in parallel to each other. The two induction coils 23 are arranged the same as the induction coils of the above-mentioned third embodiment.

The first induction coil assembly is distributed on a circumference corresponding to an edge area of the dielectric window 31. The second induction coil assembly is distributed on the circumference corresponding to a central area of the dielectric window 31. In addition, the two induction coils 32 of the first induction coil assembly and the two induction coils 33 of the second induction coil assembly are connected in parallel to each other. The power input end of each induction coil is electrically connected to the RF power supply 35.

In some embodiments, the two induction coils 32 of the first induction coil assembly is grounded through the capacitor 34, and the two induction coils 33 of the second induction coil assembly is directly grounded without arranging the capacitor 34. Of course, in practical applications, the capacitor 34 may also be arranged at the ground end of the induction coil 33, or the induction coils of the first and second induction coil assemblies may also be directly grounded.

In addition, in practical applications, the structure and the size of the induction coils of the two induction coil assemblies may be same or different.

Figure 9:
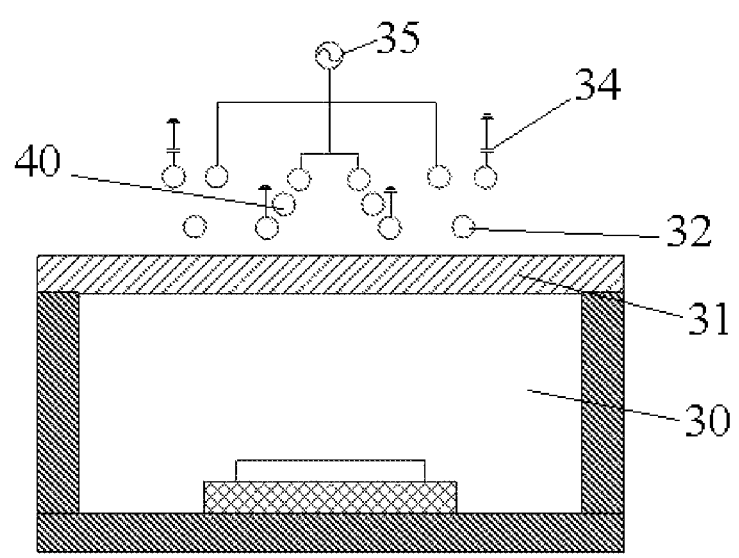
FIG. 9 illustrates a cross-section view of a reaction chamber according to a fifth embodiment of the present disclosure.

Referring to FIG. 9, a fifth embodiment of the present disclosure provides a reaction chamber 30. Compared to the reaction chamber shown in FIG. 8, a difference is that one induction coil assembly is included, and the induction coil assembly includes two induction coils 32 connected parallel to each other. The two induction coils 32 are arranged the same as the induction coil of the above-mentioned third embodiment.

In addition, the reaction chamber 30 also includes a cone-shaped induction coil assembly. The cone-shaped induction coil assembly and the induction coil assembly are located on two circumferences with different radiuses centered on the axis of the dielectric window 31, respectively. Moreover, a radius of a circumference, on which the cone-shaped induction coil assembly is located is smaller than a radius of a circumference, on which the induction coil assembly is located. Specifically, the induction coil assembly is distributed on the circumference corresponding to the edge area of the dielectric window 31. The cone-shaped induction coil assembly is distributed on the circumference corresponding to the central area of the dielectric window 31.

In some embodiments, the cone-shaped induction coil assembly includes two cone-shaped induction coils 40 connected in parallel to each other. That is, the two cone-shaped induction coils 40 of embodiments of the present disclosure replace the two induction coils 33 of the second induction coil assembly shown in FIG. 8.

Specifically, the two cone-shaped induction coils 40 all may have a three-dimensional spiral structure. A spiral radius may gradually decrease from bottom to top along a vertical direction to form an approximate "cone" shape. The two cone-shaped induction coils 40 may be centrosymmetric about the axis of the cone-shaped induction coil. That is, one of the cone-shaped induction coils may coincide with the other cone-shaped induction coil after rotating 180° around its axis. That is, the spiral directions of the two cone-shaped induction coils 40 are opposite.

An end of each cone-shaped induction coil 40 farther from the dielectric window 31 is a power input end. The power input end is electrically connected to the RF power supply 35. The end of each con-shaped induction coil 40 closer to the dielectric window 31 is a ground end. The ground end is directly grounded. In addition, in induction coil assembly, an end of each induction coil 32 close to the edge of the chamber is a ground end, and an end of each induction coil 32 close to the center of the chamber is a power input end.

As mentioned above, a portion of the cone-shaped induction coil 40 with a smaller spiral radius is farther from the dielectric window. A portion with a larger spiral radius is closer to the dielectric window. As such, capacitive coupling of an end of the cone-shaped induction coil 40 close to the dielectric window may be reduced to reduce the sputtering on the dielectric window and improve the process result. Meanwhile, the induction coils of the two induction coil assemblies may realize an RF connection using a manner of "outside in and inside out". That is, the end of each induction coil close to the edge of the chamber is the ground end, and the end of each induction coil close to the center of the chamber is the power input end. As such, it is beneficial to improve the angular uniformity of the plasma to improve the process uniformity.

It should be noted that, in some embodiments, the radius of the circumference, on which the cone-shaped induction coil assembly is located, is smaller than the radius of the circumference, on which the induction coil assembly is located. However, the present disclosure is not limited to this. In practical applications, the radius of the circumference, on which the cone-shaped coil group is located, may be larger than the radius of the circumference, on which the induction coil assembly is located. That is, the cone-shaped induction coil assembly may be distributed on the circumference corresponding to the edge area of the dielectric window 31. The induction coil assembly may be distributed on the circumference corresponding to the central area of the dielectric window 31.

It should also be noted that, in some embodiments, the end of each cone-shaped induction coil 40 closer to the dielectric window 31 may be directly grounded. However, the present disclosure is not limited to this. In practical applications, the end of each cone-shaped induction coil 40 closer to the dielectric window 31 may be grounded through a capacitor.

Embodiments of the present disclosure provide a reaction chamber. By using the above-mentioned induction coil assemblies provided by embodiments of the present disclosure, by ensuring that the coupling strength of the RF magnetic field satisfies the requirements, the capacitive coupling of the two ends of the induction coil may be reduced. Thus, the sputtering on the dielectric window may be reduced, and the process results may be improved.

It can be understood that the above embodiments are merely exemplary embodiments used to illustrate the principle of the present disclosure. However, the present disclosure is not limited to this. For those of ordinary skill in the art, various modifications and improvements may be made without departing from the spirit and essence of the present disclosure. These modifications and improvements are within the scope of the present disclosure.

What is claimed is:
1. An induction coil assembly, comprising:
an induction coil arranged over of a dielectric window of a reaction chamber, two ends of the induction coil including a power input end and a ground end, respectively, wherein:
the induction coil includes a plurality of spiral coil segments;
a spiral radius of each the plurality of spiral coil segments decreases gradually from a first end of the induction coil to a second end of the induction coil; and
a vertical distance between each end of the two ends of the induction coil and the dielectric window is greater than a vertical distance between a portion between the two ends of the induction coil and the dielectric window.

2. The induction coil assembly according to claim 1, wherein:
the induction coil includes a first coil segment and a second coil segment connected in series that have a three-dimensional spiral structure;
a spiral radius of the first coil segment decreases gradually from the first end of the induction coil to a series connection point of the first coil segment and the second coil segment;

a spiral radius of the second coil segment decreases gradually from the series connection point of the first coil segment and the second coil segment to the second end of the induction coil;

a vertical distance between the first coil segment and the dielectric window decreases gradually from the first end of the induction coil to the series connection point of the first coil segment and the second coil segment; and a vertical distance between the second coil segment and the dielectric window decreases gradually from the second end of the induction coil to the series connection point.

3. The induction coil assembly according to claim 2, wherein lengths of the first coil segment and the second coil segment are both three-quarter turn or an integer multiple of the three-quarter turn.

4. The induction coil assembly according to claim 2, wherein:
the first end of the induction coil close to the first coil segment is the power input end; and
the second end of the induction coil close to the second segment is the ground end.

5. The induction coil assembly according to claim 1, wherein the induction coil includes:
a first coil segment having a three-dimensional spiral structure;
a second coil segment having a planner spiral structure; and
a third coil segment having a three-dimensional spiral structure;
wherein:
the first coil segment, the second coil segment, and the third coil segment are connected in series from the first end of the induction coil to the second end of the induction coil;
a spiral radius of the first coil segment decreases gradually from the first end of the induction coil to a first series connection point of the first coil segment and the second coil segment;
a spiral radius of the second coil segment decreases gradually from the first series connection point to a second series connection point of the second coil segment and the third coil segment;
a spiral radius of the third coil segment decreases gradually from the second series connection point to the second end of the induction coil;
a vertical distance between the first coil segment and the dielectric window decreases gradually from the first end of the induction coil to the first series connection point;
a vertical distance between the third coil segment and the dielectric window decreases gradually from the second end of the induction coil to the second series connection point; and
vertical distances between positions of the second coil segment and the dielectric window are same.

6. The induction coil assembly according to claim 5, wherein lengths of the first coil segment, the second coil segment, and the third coil segment are all half turn or an integer multiple of the half turn.

7. The induction coil assembly according to claim 5, wherein:
the first end of the induction coil close to the first coil segment is the power input end; and
the second end of the induction coil close to the third coil segment is the ground end.

8. The induction coil assembly according to claim 1, wherein vertical distances between the two ends of the induction coil and the dielectric window are same.

9. The induction coil assembly according to claim 1, wherein the vertical distance between each end of the two ends of the induction coil and a lower surface of the dielectric window range from 10 to 50 mm.

10. The induction coil assembly according to claim 1, wherein:
the coil assembly includes one induction coil; or
the coil assembly includes two induction coils, being arranged coaxially, sleeved with each other, and centrosymmetric about axes of the induction coils.

11. The induction coil assembly according to claim 1, wherein a cross-sectional shape of the induction coil includes a rectangle, a circle, a triangle, a trapezoid, or a diamond shape.

12. A reaction chamber, comprising:
a dielectric window; and
an induction coil assembly including:
an induction coil arranged over the dielectric window, wherein:
two ends of the induction coil include a power input end and a ground end, respectively;
the power input end is electrically connected to an RF power supply, and the ground end is electrically connected to ground;
the induction coil includes a plurality of spiral coil segments;
a spiral radius of each the plurality of spiral coil segments decreases gradually from a first end of the induction coil to a second end of the induction coil; and
a vertical distance between each end of the two ends of the induction coil and the dielectric window is greater than a vertical distance between a portion between the two ends of the induction coil and the dielectric window.

13. The reaction chamber according to claim 12, further comprising a capacitor connected between the ground end and the ground.

14. The reaction chamber according to claim 13, wherein the capacitor ranges from C1 to C2:

$$C1 = \frac{1}{\omega^2 L}; \text{ and}$$

$$C2 = \frac{4}{\omega^2 L};$$

wherein $\omega$ denotes an angular frequency, and L denotes an inductance of the induction coil.

15. The reaction chamber according to claim 13, wherein:
the reaction chamber includes one induction coil assembly; or
the reaction chamber includes a plurality of induction coil assemblies and the plurality of induction coil assemblies are distributed on a plurality of circumferences with different radiuses and centered on an axis of the dielectric window;
power input ends of the plurality of induction coil assemblies are each electrically connected to the same RF power supply; and
the reaction chamber includes a plurality of capacitors, ground ends of the plurality of induction coil assemblies being electrically connected to the plurality of capacitors in a one-to-one correspondence.

16. The reaction chamber according to claim 12, wherein the reaction chamber includes one induction coil assembly, an end of the induction coil farther from the dielectric window being the power input end, and an end of the induction coil closer to the dielectric window being the ground end;

the reaction chamber further comprising one cone-shaped induction coil assembly, the cone-shaped induction coil assembly and the induction coil assembly being located on two circumferences with different radiuses centered on an axis of the dielectric window, including:
two cone-shaped induction coils arranged over the dielectric window and all having a three-dimensional spiral structure and centered on axes of the cone-shaped induction coils, wherein a spiral radius of each cone-shaped induction coil decreases gradually from bottom to top along a vertical direction, an end of each cone-shaped induction coil farther from the window dielectric window is the power input end, and an end of each cone-shaped induction coil closed to the dielectric window is the ground end.

17. The reaction chamber according to claim 16, wherein a radius of a circumference, on which the cone-shaped induction coil is located, is smaller than a radius of a circumference, on which the cone-shaped induction coil is located.

18. The reaction chamber according to claim 12, wherein:
the induction coil includes a first coil segment and a second coil segment connected in series that have a three-dimensional spiral structure;
a spiral radius of the first coil segment decreases gradually from the first end of the induction coil to a series connection point of the first coil segment and the second coil segment;
a spiral radius of the second coil segment decreases gradually from the series connection point of the first coil segment and the second coil segment to the second end of the induction coil;
a vertical distance between the first coil segment and the dielectric window decreases gradually from the first end of the induction coil to the series connection point of the first coil segment and the second coil segment; and
a vertical distance between the second coil segment and the dielectric window decreases gradually from the second end of the induction coil to the series connection point.

19. The reaction chamber according to claim 12, wherein the induction coil includes:
a first coil segment having a three-dimensional spiral structure;
a second coil segment having a planner spiral structure; and
a third coil segment having a three-dimensional spiral structure;
wherein:
the first coil segment, the second coil segment, and the third coil segment are connected in series from a first end of the induction coil to a second end of the induction coil;
a spiral radius of the first coil segment decreases gradually from the first end of the induction coil to a first series connection point of the first coil segment and the second coil segment;
a spiral radius of the second coil segment decreases gradually from the first series connection point to a second series connection point of the second coil segment and the third coil segment;
a spiral radius of the third coil segment decreases gradually from the second series connection point to the second end of the induction coil;
a vertical distance between the first coil segment and the dielectric window decreases gradually from the first end of the induction coil to the first series connection point;
a vertical distance between the third coil segment and the dielectric window decreases gradually from the second end of the induction coil to the second series connection point; and
vertical distances between positions of the second coil segment and the dielectric window are same.

20. The reaction chamber assembly according to claim 12, wherein
the coil assembly includes one induction coil; or
the coil assembly includes two induction coils, being arranged coaxially, sleeved with each other, and centrosymmetric about axes of the induction coils.

* * * * *